(12) United States Patent
Koo et al.

(10) Patent No.: US 11,362,655 B2
(45) Date of Patent: Jun. 14, 2022

(54) RF SWITCH DEVICE

(71) Applicant: DB HiTek Co., Ltd., Bucheon-si (KR)

(72) Inventors: Ja-Geon Koo, Eumseong-gun (KR);
Jin-Hyo Jung, Suwon-si (KR);
Hae-Taek Kim, Bucheon-si (KR);
Seung-Hyun Eom, Seoul (KR);
Ki-Won Lim, Suwon-si (KR);
Hyun-Joong Lee, Daejeon (KR);
Sang-Yong Lee, Chungju-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 0 days.

(21) Appl. No.: 17/185,728

(22) Filed: Feb. 25, 2021

(65) Prior Publication Data
US 2021/0281260 A1 Sep. 9, 2021

(30) Foreign Application Priority Data

Mar. 4, 2020 (KR) .......................... 10-2020-0026951

(51) Int. Cl.
| | |
|---|---|
| *H03K 17/693* | (2006.01) |
| *H01L 27/12* | (2006.01) |
| *H04B 1/48* | (2006.01) |
| *H01L 27/088* | (2006.01) |
| *H01L 23/66* | (2006.01) |

(52) U.S. Cl.
CPC ......... *H03K 17/693* (2013.01); *H01L 27/088* (2013.01); *H01L 27/1203* (2013.01); *H04B 1/48* (2013.01); *H01L 23/66* (2013.01)

(58) Field of Classification Search
CPC ... H01L 27/1203; H01L 27/088; H01L 33/66; H01L 29/0649; H01L 29/0646; H01K 17/693; H04B 1/48
USPC ....................................................... 257/316
See application file for complete search history.

(56) References Cited

U.S. PATENT DOCUMENTS

| | | | |
|---|---|---|---|
| 8,482,337 B2 | 7/2013 | Sugiura | |
| 2012/0154018 A1 | 6/2012 | Sugiura | |
| 2016/0372429 A1* | 12/2016 | Cho | ........................ H01L 23/66 |

FOREIGN PATENT DOCUMENTS

KR     10-2012-0069528 A     6/2012

* cited by examiner

*Primary Examiner* — Thinh T Nguyen
(74) *Attorney, Agent, or Firm* — Andrew D. Fortney; Central California IP Group, P.C.

(57) ABSTRACT

Provided is an RF switch device (100) in which body contact regions (190) are formed at respective positions adjacent to or partially overlapping opposite ends of a gate region (110) so that holes in a body of the device can escape or flow in either or both of two directions, rather than in only a single direction.

18 Claims, 6 Drawing Sheets

RF SWITCH DEVICE

CROSS REFERENCE TO RELATED APPLICATION

The present application claims priority to Korean Patent Application No. 10-2020-0026951, filed Mar. 4, 2020, the entire contents of which is incorporated herein for all purposes by this reference.

BACKGROUND OF THE INVENTION

Field of the Invention

The present disclosure relates to an RF switch device 100. More particularly, the present disclosure relates to an RF switch device in which body contact regions 190 are formed at respective positions adjacent to or partially overlapping opposite ends of a gate region 110 so that holes in a body of the device are released in two directions rather than one direction.

Description of the Related Art

The present disclosure relates to a layout structure of an RF switch device. More particularly, the present disclosure relates to a method of improving radio frequency (RF) performance by changing a layout structure of an MOS transistor. In general, when an RF switch device is made from silicon, there are numerous limitations on the device characteristics that can result in degradation of the characteristics. A metal-oxide-semiconductor (MOS) transistor includes a gate electrode and source and drain regions that are formed at opposite sides of the gate electrode in a substrate, with the gate electrode disposed therebetween. The MOS transistor is one representative device constituting an integrated circuit, and is widely used as a switch for control, logic, and power throughout memory devices and non-memory devices.

The performance of the RF switch device may be considered in terms of two parts: a figure of merit (FoM) and the breakdown voltage. Increasing the length of the gate may increase the breakdown voltage, but as the length of the gate increases, the on-resistance (Ron) increases, resulting in an increase in the figure of merit (FoM). Conversely, decreasing the length of the gate may decrease the figure of merit (FoM), but the breakdown voltage decreases. That is, since the figure of merit (FoM) and the breakdown voltage have a trade-off or inverse relationship, there is a limit in improving both simultaneously.

Om addition, in a general RF switch device, during its operation, when a sufficiently high voltage is applied to the drain region, holes can be generated in the drain region due to impact ionization. In a general bulk MOSFET, the holes escape through the substrate. However, in an SOI MOSFET (i.e., a MOSFET made on a silicon-on-insulator [SOI] substrate), because of the floating body, the holes cannot escape into the substrate, and thus need to escape elsewhere (e.g., into the source region). Nevertheless, the holes that have not escaped accumulate in the floating body near the source region. As a result, the electric potential of the floating body increases, and this increase decreases the threshold voltage, which causes the so-called "kink effect," in which the current increases suddenly even before the breakdown voltage is reached.

FIG. 1 is a reference diagram showing a layout of a RF switch device in the related art.

Referring to FIG. 1, in order to solve problems caused by the above-described floating body, a general RF switch device 900 in the related art is configured such that a body contact region is connected to a body region having a first conductivity type. A source region 920 is on a first side of a gate region 910, specifically, a T-shaped gate region 910, and a drain region 930 is on a second side of the gate region 910. Further, a high-concentration body contact region 940 having the first conductivity type is formed at or on yet another side of the gate region 910. Therefore, during operation of the device, the holes in the body region 900 are released by flow through a P+ channel (e.g., in or to the body contact region 940 when the first conductivity type is P-type).

Despite such a structure, there are still problems caused by the floating body. To solve the problems, the inventors of the present disclosure intend to provide an RF switch device that includes an H-shaped gate region, enabling holes in a body region to escape or flow in two directions, and that is capable of improving the breakdown voltage and the figure of merit of the RF switch device simultaneously.

The foregoing is intended merely to aid in the understanding of the background of the present disclosure, and is not intended to mean that the present disclosure falls within the purview of the related art that is already known to those skilled in the art.

Document of Related Art (Patent Document 1) Korean Patent Application Publication No. 10-2012-0069528 "HIGH-FREQUENCY SEMICONDUCTOR SWITCH".

SUMMARY OF THE INVENTION

The present disclosure is to solve the problems in the related art described above.

The present disclosure is intended to prevent the occurrence of the kink effect that is caused because holes generated by impact ionization accumulate in a floating body, resulting in an increase in the electric potential of the floating body and a decrease in the threshold voltage. The present disclosure is directed to an RF switch device including body contact regions at opposite sides of an H-shaped gate electrode, so that the holes in the body region are released in two directions through the body contact regions, thereby improving the breakdown voltage of the RF switch device.

Specifically, the present disclosure is directed to an RF switch deice including a body region having a first conductivity type in a first active area, a first well region having the first conductivity type in an extended area and a second well region having the first conductivity type in a second active area, connected to each other so that holes in the body region are released in two directions.

In addition, the present disclosure is directed to an RF switch device including a pair of body contact regions that improve the breakdown voltage without degrading the figure of merit (FoM), which has a trade-off or inverse relationship with the breakdown voltage.

In addition, the present disclosure is directed to an RF switch device including an isolation region that, in effect, partially removes the source region and the drain region of the RF switch device. The source and drain regions are conductive regions of in the active area of the RF switch device, and partially removing (or reducing the areas or sizes of) these regions limits the increase in the capacitances of parasitic capacitors Cgs (between the gate and the source of the RF switch device) and Cgd (between the gate and the drain of the RF switch device).

In addition, the present disclosure is directed to an RF switch device in which the width of the isolation region in a first direction is smaller than a separation distance between first electrodes (that may be part of the RF switch device) and that includes an additional source region, an additional drain region, and a corresponding additional channel region, thus increasing the current path(s) and improving the figure of merit.

In addition, the present disclosure is directed to RF switch device as described above, including an isolation region having a width in a first direction that is smaller than a separation distance between first electrodes, to minimize any increase in the parasitic capacitance, while at the same time forming an additional channel region in the RF switch device.

In addition, the present disclosure is directed to an RF switch device including both an H-shaped gate electrode and an isolation region that simultaneously improve the breakdown voltage and the figure of merit (FoM).

The present disclosure may be implemented by one or more embodiments having the following configuration(s) to achieve the above-described objectives.

According to one or more embodiments of the present disclosure, there is provided an RF switch device including: a first active area including a source region having a second conductivity type and a drain region having the second conductivity type spaced apart from the source region in a first direction; a pair of extended areas of which respective first ends are adjacent to opposite ends of the first active area in a second direction; a pair of second active areas adjacent to respective second ends of the pair of the extended areas; and an H-shaped gate electrode including a first electrode in the first active area, the first electrode having a length in the second direction, and a pair of second electrodes, each in respective ones of the pair of the extended areas and respectively connected to opposite ends of the first electrode, the pair of second electrodes having a length in the first direction. The second direction may be orthogonal to the first direction.

According to other embodiments) of the present disclosure, the RF switch device may further include: a buried oxide (BOX) layer on a semiconductor substrate; and a semiconductor layer on the BOX layer.

According to other embodiment(s) of the present disclosure, in the RF switch device, the first active area may further include a body region in the semiconductor layer, having a first conductivity type.

According to other embodiment(s) of the present disclosure, in the RF switch device, each of the pair of extended areas may include a first well region below the second electrode and in the semiconductor layer, having the first conductivity type.

According to other embodiment(s) of the present disclosure, in the RF switch device, each of the second active areas may include a second well region in the semiconductor layer, having the first conductivity type, and the second well region may be connected to the body region through the first well region.

According to other embodiment(s) of the present disclosure, the RF switch device may be configured such that holes in the body region (which may result from impact ionization) may escape or flow through the pair of second active areas.

According to other embodiment(s) of the present disclosure, there is provided an RF switch device including: a first active area including a source region having a second conductivity type and a drain region having the second conductivity type spaced apart from the source region in a first direction; a pair of extended areas of which respective first ends are adjacent to opposite ends of the first active area in a second direction; a pair of second active areas adjacent to respective second ends of the pair of the extended areas; an H-shaped gate electrode including a first electrode in the first active area, the first electrode having a length in the second direction, and second electrodes, each in respective ones of the pair of the extended areas and respectively connected to opposite ends of the first electrode, the pair of second electrodes having a length in the first direction; and isolation regions below the second electrodes, in a semiconductor layer in the extended areas. The second direction may be orthogonal to the first direction.

According to other embodiment(s) of the present disclosure, the RF switch device may include a plurality of the first electrodes, and the isolation regions may have a width in the first direction (e.g., along a length of the) that may be smaller than a separation distance between adjacent ones of the first electrodes.

According to other embodiment(s) of the present disclosure, the RF switch device may comprise a plurality of the first electrodes, and the isolation regions may not overlap in the first direction with any of the plurality of first electrodes in the first active area.

According to other embodiment(s) of the present disclosure, in the RF switch device, the isolation regions may have ends facing each other in the second direction that are at least partially in the first active area According to other embodiment(s) of the present disclosure, the RF switch device may further include a device isolation film around the first active area, the extended areas, and the second active areas.

According to other embodiment(s) of the present disclosure, the RF switch device may further include a body region in the first active area, the body region having the first conductivity type, the pair of the second active areas may include contact regions having the first conductivity type in the semiconductor layer, and the contact regions may be connected to the body region.

According to other embodiment(s) of the present disclosure, there is provided an RF switch device including: a first active area including a source region having a second conductivity type and a drain region having the second conductivity type spaced apart from the source region in a first direction; a pair of extended areas of which respective first ends are adjacent to opposite ends of the first active area in a second direction; a pair of second active areas adjacent to second ends of the pair of the extended areas, respectively; and an H-shaped gate electrode including a first electrode in the first active area, the first electrode having a length in the second direction, and second electrodes connected to respective opposite ends of the first electrode, wherein each of the second electrodes is in a respective one of the pair of extended areas and has a length in the first direction; wherein the extended areas include multiple isolation regions in a semiconductor layer (e.g., of the RF switch device) below the second electrodes, the isolation regions (e.g., in each extended area) are spaced apart from each other in the first direction, and the isolation regions have ends facing each other in the second direction that are at least partially in the first active area, and that do not overlap in the first direction with the first electrode in the first active area Such an arrangement of the first electrode, second electrodes, and isolation regions may provide an additional channel region. The second direction may be orthogonal to the first direction.

According to other embodiments) of the present disclosure, the RF switch device may further include: a buried oxide (BOX) layer on a semiconductor substrate; the semiconductor layer on the BOX layer; and a body region in the first active area, wherein the first active area, the extended areas, and the second active areas may include regions having a first conductivity type in the semiconductor layer, configured such that holes in the body region may escape or flow through the pair of second active areas.

According to other embodiment(s) of the present disclosure, in the RF switch device, the first active area may include the source region and the drain region, the semiconductor layer may include a body region having a first conductivity type, each of the pair of the extended areas may include a first well region in the semiconductor layer and below the second electrode, each extended area having the first conductivity type, and each of the pair of second active areas may include a second well region in the semiconductor layer, having the first conductivity type.

According to other embodiment(s) of the present disclosure, there is provided an RF; switch device that includes a first active area having a channel region; a pair of extended areas having respective first ends adjacent to opposite ends of the first active area in a second direction; a pair of second active areas adjacent to respective second ends of the pair of the extended areas; a body region connected to the second active areas through the extended areas; a buried oxide (BOX) layer on a semiconductor substrate; a semiconductor layer on the BOX layer; an H-shaped gate electrode including a first electrode in the first active area, the first electrode having a length in the second direction, and second electrodes in the pair of extended areas, the second electrodes having a length in a first direction; the body region, in the semiconductor layer in the first active area and having a first conductivity type; a source region and a drain region in the semiconductor layer, having a second conductivity type and spaced apart from each other by a predetermined distance; and multiple isolation regions in the extended areas, below the second electrodes and in the semiconductor layer, spaced apart from each other. The predetermined distance may be related to a dimension (e.g., a line width) of the first electrode. The second direction may be orthogonal to the first direction.

According to other embodiment(s) of the present disclosure, the RF switch device may further include: an additional drain region and an additional source region between facing sides of adjacent ones of the isolation regions adjacent to each other in the first direction, configured to provide an additional channel region.

According to other embodiment(s) of the present disclosure, in the RF switch device, the second electrodes may have a width in the second direction less than 0.58 µm.

According to the above configurations, the present disclosure has the following effects. The present disclosure is intended to prevent the occurrence of the link effect that is caused by holes generated by impact ionization accumulating in a floating body, increasing the electric potential of the floating body, and decreasing a threshold voltage (e.g., of the RF switch device). According to the present disclosure, body contact regions are at opposite sides of an H-shaped gate electrode, respectively, so that the holes in the body region can escape or flow in two directions through the body contact regions, thereby improving the breakdown voltage (e.g., of the RF switch device).

Specifically, according to the present disclosure, a body region having the first conductivity type in the first active area a first well region having the first conductivity type in the extended area, and a second well region having the first conductivity type in the second active area are connected to each other so that the holes in the body region can escape or flow in two directions.

In addition, according to the present disclosure, a pair of body contact regions can improve the breakdown voltage, and the figure of merit (FoM), which has a trade-off or inverse relationship with the breakdown voltage, can be maintained.

In addition, according to the present disclosure, an isolation region is provided that effectively partially removes the source region and the drain region (i.e., conductive regions in the first active area), thereby limiting an increase in the parasitic capacitances Cgs (between the gate and the source) and Cgd (between the gate and the drain).

In addition, according to the present disclosure, the width of the isolation region in the first direction is smaller than the separation distance between the first electrodes, to form an additional source region, an additional drain region, and a corresponding additional channel region, and thus current path(s) can be increased, and the overall figure of merit can be improved.

In addition, according to the present disclosure, as described above, the width of the isolation region in the first direction is smaller than the separation distance between the first electrodes, to prevent parasitic capacitance(s) from increasing, and simultaneously forming the additional channel region.

In addition, according to the present disclosure, both the H-shaped gate electrode and the isolation regions can simultaneously improve the breakdown voltage and the figure of merit (FoM).

Meanwhile, effects described in the following specification and provisional or potential effects thereof that are expected by the technical features of the present disclosure, are considered as effects described in the present disclosure, even though these effects may not be clearly mentioned herein.

BRIEF DESCRIPTION OF THE DRAWINGS

The above and other objectives, features, and other advantages of the present disclosure will be more clearly understood from the following detailed description when taken in conjunction with the accompanying drawings, in which.

Figure 1:
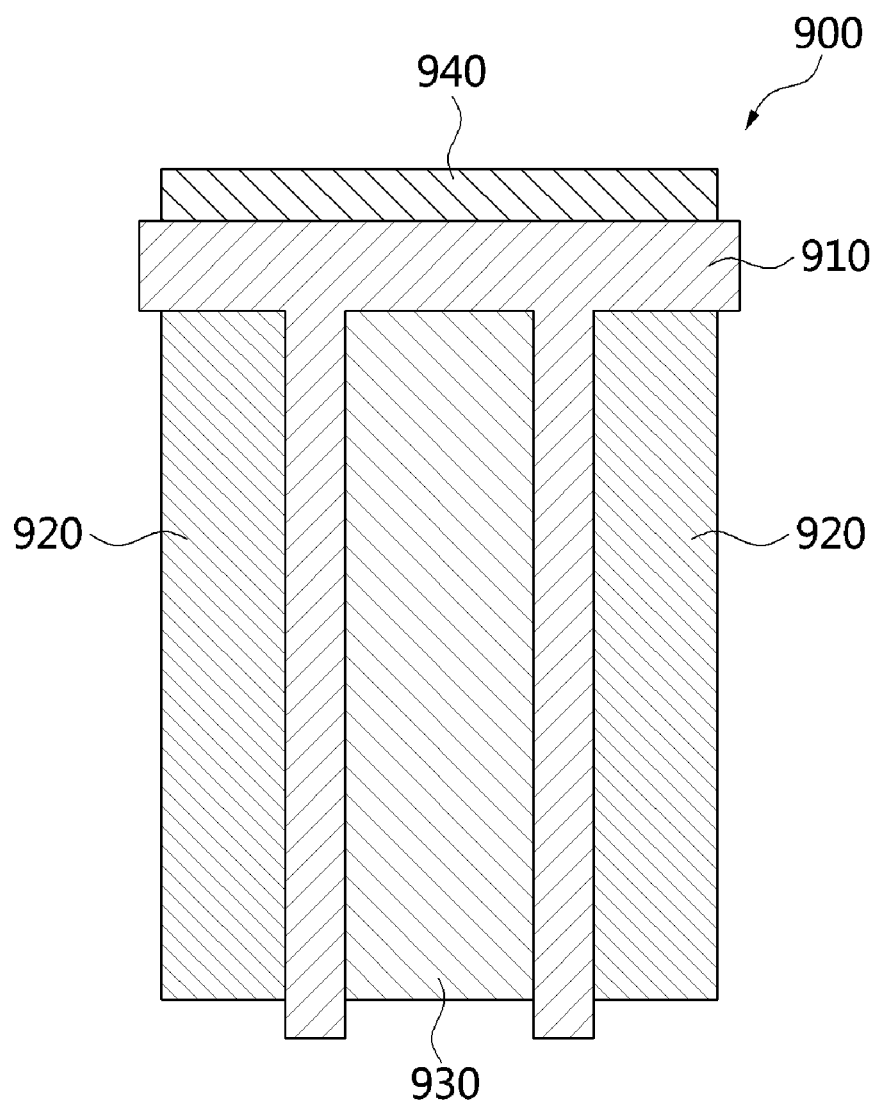
FIG. 1 is a reference diagram showing a layout of a RF switch device in the related art.

The accompanying drawings are exemplified by reference for understanding the technical idea of the present disclosure, and the scope of the present disclosure is not limited by the drawings.

DETAILED DESCRIPTION OF THE INVENTION

It is noted that embodiments of the present disclosure may be changed to a variety of different embodiments. The scope of the present disclosure should not be interpreted as being limited to the embodiments described hereinbelow, but may be interpreted on the basis of the appended claims. In addition, the embodiments of the present disclosure are provided for reference in order to fully describe the disclosure for those skilled in the art.

In the following specification, when one element is referred to as being "on", "above", "at a side of", or "at a portion of" another element, the first element may be in contact with the surface of another element, or the one element may be spaced apart from the other element by a predetermined distance. In addition, when one element is spaced apart from another element, a third element between the elements. Further, when one element is "directly on" or "directly above" another element, there are no intervening elements between the two elements.

The terms "first", "second", etc. may be used to describe various items, such as various elements, regions, and/or parts, but the items are not limited by the terms, and it is noted that a second element is not a first element.

The term "metal oxide semiconductor" or "MOS" as used herein is a general term, and the metal ("M") is not limited only to metal, but may be any of various types of conductive materials. In addition, the semiconductor ("S") may be a substrate or a semiconductor structure, and the oxide ("O") is not limited only to an oxide, but may include any of various types of organic materials or inorganic materials.

In addition, conductivity types or doped areas of elements may be defined as "p-type" or "n-type" according to main carrier characteristics, but this is only for convenience of description, and the technical idea of the present disclosure is not limited thereto. For example, hereinafter, the "p-type" or "n-type" will be referred to as more general terms a "first conductivity type" or "second conductivity type". Herein, the first conductivity type may refer to p-type conductivity, and the second conductivity type may refer to n-type conductivity.

In addition, it is to be understood that the terms "high-concentration" and "low-concentration" in reference to the doping concentration in an impurity region refer to relative doping concentrations of one impurity region relative to another impurity region.

It is to be understood that the term "first direction" as used herein refers a direction along a length of a particular structure (e.g., the direction of the channel length), and that the term "second direction" refers to a direction perpendicular or orthogonal to the first direction (e.g., the direction of the channel width). Alternatively, the "first direction" may refer to the largest dimension of a three-dimensional structure.

In addition, a contact plug may be on a source region, a drain region, a gate electrode, or a second well region, which will be described later, but a detailed description of the contact plug will be omitted for convenience of description.

Figure 2:
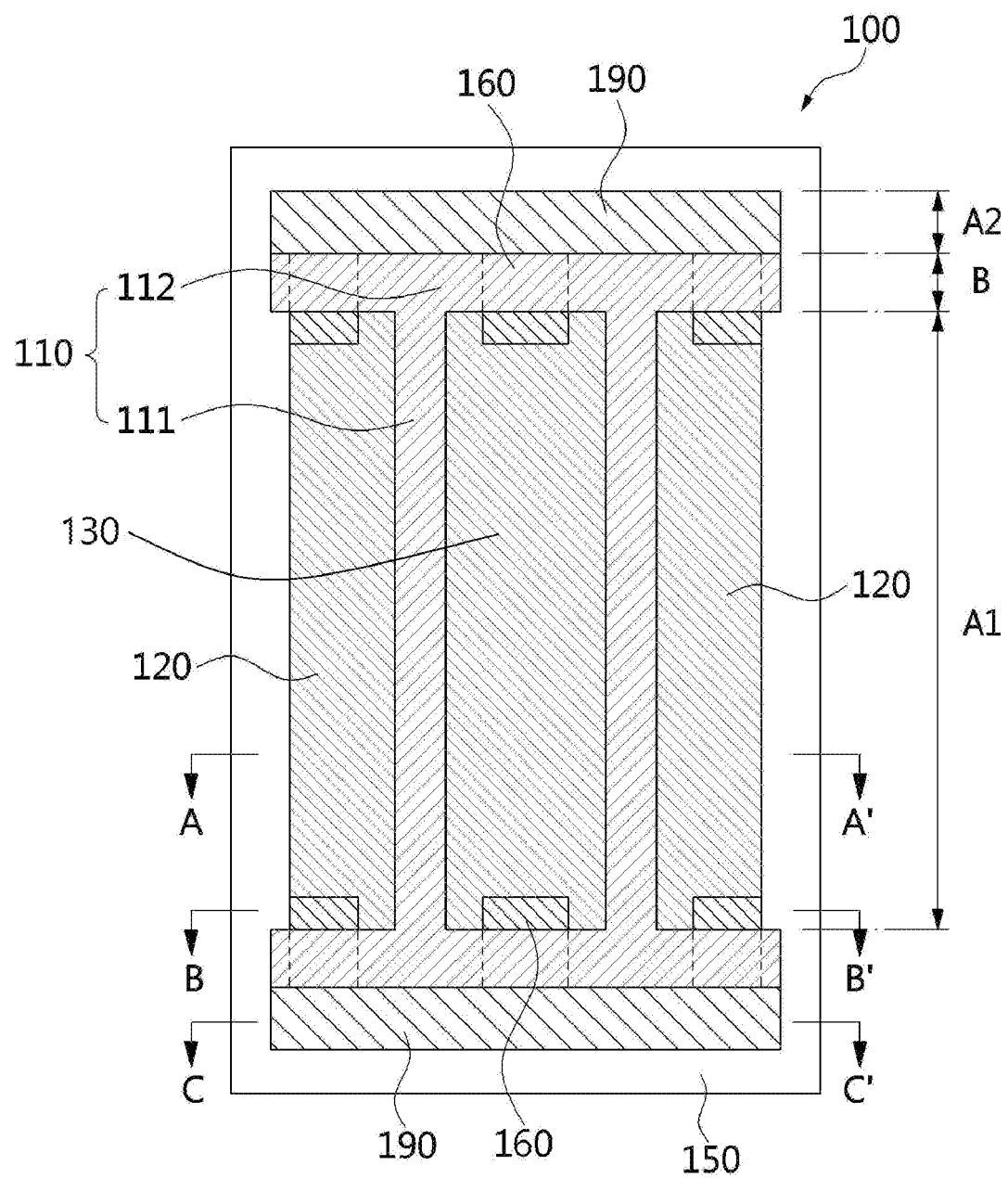
FIG. 2 is a reference diagram showing a layout of an RF switch device according to one or more embodiments of the present disclosure.

FIG. 2 is a reference diagram showing a layout of an RF switch device according to one or more embodiments of the present disclosure.

Hereinafter, an RF switch device 100 according to embodiment(s) of the present disclosure will be described in detail with reference to the accompanying drawings.

Referring to FIG. 2, the present disclosure relates to the RF switch device 100, and more specifically, to the RF switch device in which body contact regions 190 are formed at respective positions adjacent to or partially overlapping opposite ends of a gate region 110 so that holes in a body of the device 100 are released in two directions, rather than in only a single direction. As described later in detail, according to the present disclosure, the body contact regions 190 are at the opposite ends of the gate region 110, respectively, to improve the breakdown voltage (e.g., of the RF switch device 100) and maintain the figure of merit (FoM) (e.g., of the RF switch device 100), which has a trade-off or inverse relationship with the breakdown voltage.

As described above, in an SOI MOSFET, the body region is electrically isolated from the substrate, and can enter a floating state (e.g., in the absence of an applied signal or voltage). When a sufficiently high voltage is applied to the drain region for operation (e.g., of the SOI MOSFET), electrons in the channel may cause impact ionization near the drain. Since the body region is in the floating state, holes generated from the impact ionization are unable to escape into the substrate, and accumulate in the body region. Thus, the electric potential of the floating body region increases, and the threshold voltage decreases, resulting in the kink effect. In order to prevent this problem, referring to FIG. 1, it is common to include one or more body contact regions on or in the substrate to provide a path for the holes in the body region to escape or flow from the body region. The present RF switch device 100 may be or comprise an SOI MOSFET.

In addition to such a structure, the present disclosure is intended to improve the breakdown voltage by enabling the holes in the body region to escape or flow through the body contact regions 190 at opposite positions. Hereinafter, the structure will be described in detail.

According to the present disclosure, the RF switch device 100 may include, along a second direction, a first active area A1 first and second extended areas B between the first active area A1 and a second active area A2, and second active areas A2 connected to the respective first and second extended areas B. Each extended area B and each second active area A2 on opposite sides or edges of the first active area A1 along the second direction. For example, extended areas B and second active areas A2 may be symmetrical, but no limitation thereto is imposed. As will be described below, the first active area A1 may include a part of a gate electrode 110, one or more source regions 120, and a drain region 130.

The gate electrode 110 includes one or more first electrodes 111 and a pair of second electrodes 112. The first electrode(s) 111 have a length along the second direction in the first active area A1. The pair of second electrodes 112 have a length along the first direction in the extended areas B, and are connected to opposite ends of the first electrode(s) 111 (i.e., one of the pair of second electrodes 112 is connected to one end the first electrode[s] 111, and the other of the pair of second electrodes 112 is connected to the opposite end the first electrode[s] 111), The first electrode(s) 111 may be connected to the second electrodes 112, and when the gate electrode 110 comprises a plurality of the first electrodes 111, the first electrodes 111 may be in the first active area A1 and spaced apart from each other by a predetermined distance in the first direction.

The second electrodes 112 may be, comprise, or function as gate contact pads, for example. The second electrodes 112 are in a pair, in opposite extended areas B, spaced apart from each other. That is, a T-shaped gate electrode is generally used in the related art, but the RF switch device 100 according to embodiment(s) of the present disclosure includes an H-shaped gate electrode. In addition, in the first active area A1, the source region(s) 120 and the drain region 130 are on opposite sides of the (or each) first electrode 111, and the drain region 130 is spaced apart from the source region(s) 120 by a predetermined distance in the first direction. The predetermined distance may be based on or related to a length of the channel (e.g., under the first electrode 111). As described above, in the RF switch device according to embodiment(s) of the present disclosure, the body contact regions 190 are in the second active areas A2, respectively, between the extended areas B and a device isolation film 150, which is a perimeter structure, so that the holes in the body region can flow in either or both of two directions through the body contact regions 190 at the opposite ends of the RF switch device 100 and/or gate electrode 110, thereby improving (enhancing) the breakdown voltage.

In addition, the device isolation film 150 is around (or outside the perimeter of) the first active area A1, the extended areas B, and the second active areas A2, so that individual devices (e.g., individual RF switch devices 100 on a common substrate) are driven separately. In each of the extended areas B, multiple isolation regions 160 are below the corresponding second electrode 112, and are spaced apart from each other along the first direction.

Herein, each of the isolation regions 160 is below the second electrode 112 in the extended area B and between adjacent first electrodes 111. Further, an end portion of the isolation region 160 may partially overlap with (e.g., be in) the first active area A1, and opposite sides or edges of the isolation regions 160 are placed spaced apart from the first electrode(s) 111 by a predetermined distance so as to not overlap with the first electrode(s) 111.

That is, a width of the isolation region 160 in the first direction is smaller than a width of the source region(s) 120 and/or of the drain region 130 in the first direction. Therefore, there are separation spaces between the opposite sides or edges of the isolation region 160 and the first electrode(s) 111. The separation spaces are part of the source region(s) 120 and the drain region 130. Alternatively, they may be or form one or more additional source regions 120 and an additional drain region 130, so there may be an advantage because an additional channel region may exist below the first electrode(s) 111 at the corresponding position(s).

As a result, one or more dimensions of the current path (e.g., below the first electrode[s] 111) may increase so that the on-resistance (Ron) (e.g., of the RF switch device 100) improves. Herein, a plurality of the isolation regions 160 are in each extended area B, and thus additional channel regions may also be adjacent to a boundary between the first active area A1 and the extended areas B. The isolation regions 160 are spaced apart from the channel regions, and thus do not affect the width or length of the channel regions, which determine the driving characteristics of the RF switch device.

In addition, to acquire an additional channel region (e.g., below the second electrodes 112), a width of the second electrode(s) 112 may be relatively narrow in the second direction, and in the correspondingly increased first active area. A1, there is an effect of partially removing the source region(s) 120 and the drain region 130 (i.e., conductive regions adjacent to the second electrodes 112), Therefore, increases in the capacitance of a parasitic capacitor Cgs between a gate (e.g., gate electrode 110) and a source (e.g., source regions 120) and of a parasitic capacitor Cgd between the gate (e.g., gate electrode 110) and a drain (e.g., drain region 130) may be limited (e.g., as much as possible) or reduced, relative to an otherwise identical RF switch device without the isolation regions 160). Preferably, each of the isolation regions 160 is smaller than the width of the second electrode 112 in the second direction to (e.g., 0.58 μm in the related art). Therefore, a current path (e.g., for holes in the body region of the RF switch device 100) may consequently result from the additional channel.

An increase in parasitic capacitance increases the size of a delay constant (RC) (e.g., of the RF switch device 100), and the delay constant is inversely proportional to the signal transmission speed. Therefore, an increase in parasitic capacitance (e.g., of the RF switch device 100) decreases the overall signal transmission speed of a chip (e.g., containing the RF switch device 100), and thus degrades the characteristics of the device (e.g., of the RF switch device 100 or the chip containing the RF switch device 100). Therefore, in a radio frequency (RF) switch, the figure of merit (FoM), which is quantified as the product of on-resistance (Ron) and off capacitance, is likely to increase (e.g., when the parasitic capacitance of the RF switch device increases). Therefore, the RF switch device 100 according to embodiment(s) of the present disclosure is able to solve the problem(s) associated with relatively large parasitic capacitance by including the isolation regions 160. In summary, the width of the pair of the second electrodes 112 in the second direction is relatively narrow so that additional channel regions may be formed thereunder, and simultaneously, as the width of the second electrodes 112 is reduced, a possible increase in parasitic capacitance is relatively limited.

Both the device isolation film 150 and the isolation regions 160 may be formed by shallow trench isolation (STI), for example, and may comprise a silicon oxide (e.g., silicon dioxide), a silicon nitride, or the like. No limitation thereto is imposed.

Figure 3:
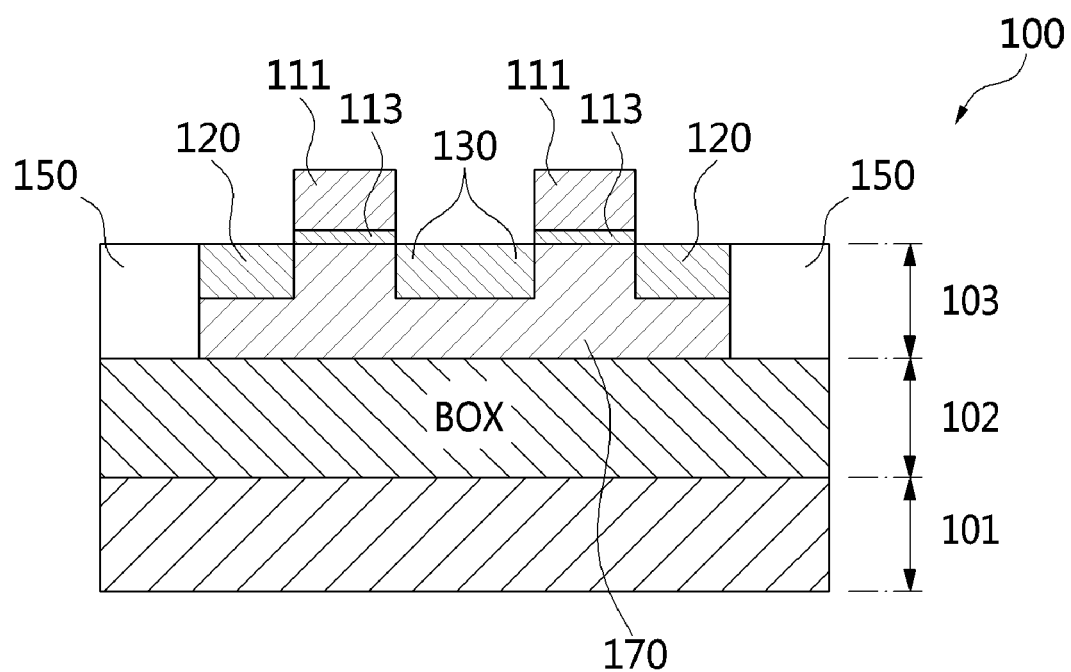
FIG. 3 is a cross-sectional view of the RF switch device taken along line A-A' of FIG. 2.
Figure 4:
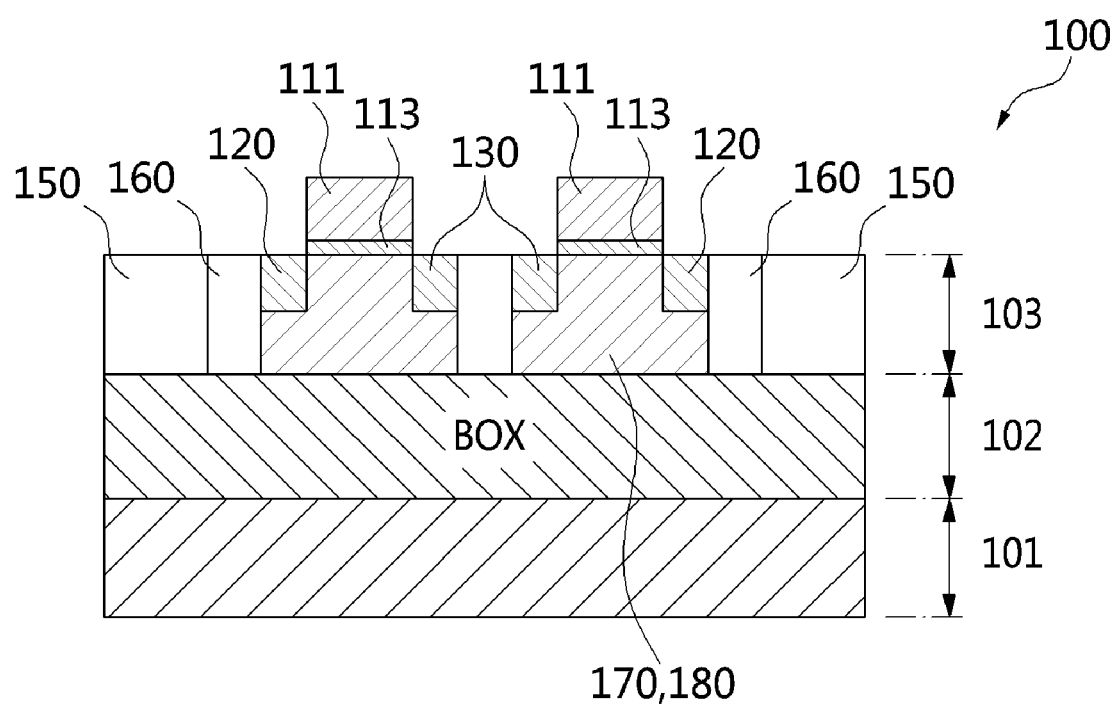
FIG. 4 is a cross-sectional view of the RF switch device taken along line B-B' of FIG.
Figure 5:
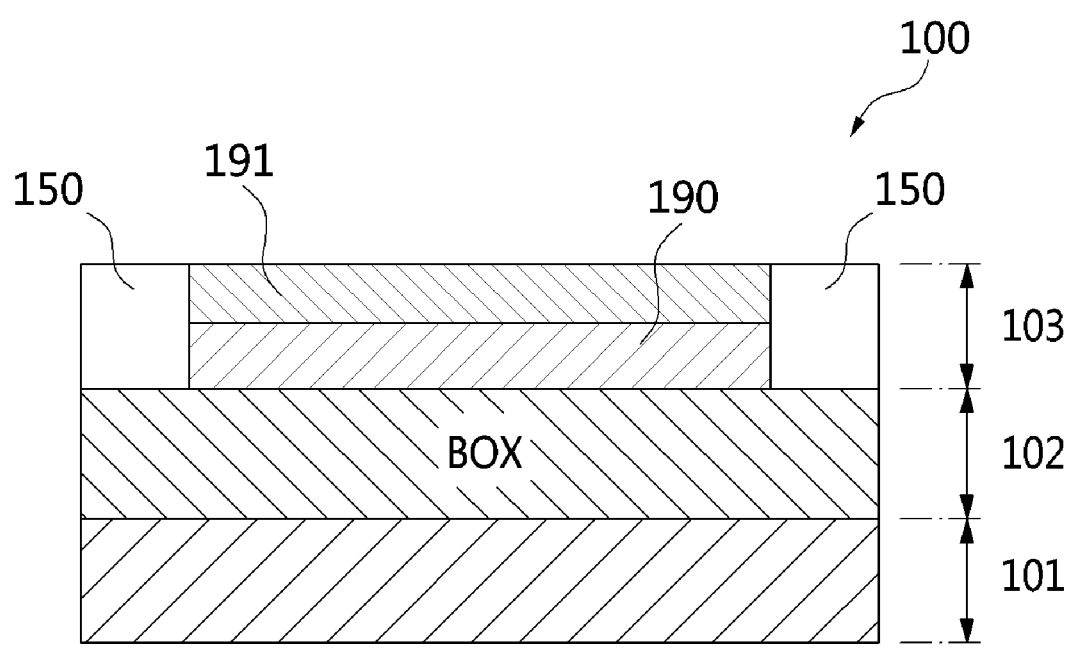
FIG. 5 is a cross-sectional view of the RF switch device taken along line C-C' of FIG. 2.

FIG. 3 is a cross-sectional view of an RF switch (e.g., RF switch device 100) device taken along line A-A' of FIG. 2. FIG. 4 is a cross-sectional view of the RF switch device taken along line B-B' of FIG. 2. FIG. 5 is a cross-sectional view of the RF switch device taken along line C-C' of FIG. 2.

Referring to FIGS. 3 to 5, according to embodiment(s) of the present disclosure, the RF switch device 100 may be on a substrate 101. For example, the substrate 101 may be a p-type doped substrate, a p-type diffusion region in a substrate, or a p-type epitaxial layer grown epitaxially on a substrate. No limitation thereto is imposed. In addition, a buried oxide (BOX) layer 102 is on the substrate 101 as an insulation layer, and a semiconductor layer 103 is on the BOX layer 102. The semiconductor layer 103 is isolated by the device isolation film 150 so that individual devices formed in the semiconductor layer 103 are driven separately. For example, the device isolation film 150 may have the same thickness as the semiconductor layer 103, but no limitation thereto is imposed.

Referring to FIG. 3, the first active area A1 includes a body region 170 having the first conductivity type in the semiconductor layer 103. The body region 170 may be formed by an ion implantation process using p-type impurities after the device isolation film 150 is formed. In addition, the source region(s) 120 having the second conductivity type may be in the body region 170, and spaced apart from the source region(s) 120 by a predetermined distance, the drain region 130 having the second conductivity type may be formed.

Between the source region(s) 120 and the drain region 130 are adjacent to each other, a channel region may be below the first electrode(s) 111. In addition, a gate insulation film 113 may be formed on the surface of the semiconductor layer 103, and the first electrode(s) 111 is formed on the gate insulation film 113 (i.e., over the semiconductor layer 103.

For example, a first end or sidewall of the first electrode(s) 111 may be above the source region(s) 120 and may partially overlap the source region(s) 120, and a second (e.g., opposite) end or sidewall of the first electrode(s) 111 may be above the drain region 130 and may partially overlap the drain region 130. However, the scope of the present disclosure is not limited thereto. The source and drain regions 120 and 130 may be formed simultaneously by ion implantation using the gate electrode 110 as an implantation mask.

The first electrode(s) 111 may generally comprise any one of conductive polysilicon, metal, a conductive metal nitride, and combinations thereof and may generally be formed by any known process, such as chemical vapor deposition (CVD), physical vapor deposition (PVD; e.g., sputtering or evaporation), atomic layer deposition (ALD), metal-organic atomic layer deposition (MOALD), metal-organic chemical vapor deposition (MOCVD), etc. No limitation thereto is imposed.

In addition, at an outer side (sidewall) of the first electrode(s) 111 and the gate insulation film 113, for example, a gate spacer (not shown) comprising one or more of an oxide film (e.g., silicon dioxide), a nitride film (e.g., silicon nitride), and a combination thereof may be conventionally formed. The gate spacer may be at one side surface, two opposed side surfaces, or all sidewalls of the first electrode(s) 110 and the gate insulation film 113, but no limitation thereto is imposed.

Referring to FIG. 4, at the boundary between the first active area A1 and the extended area B (that is, the interface or area of the additional channel region), the gate insulation film 113 is on the semiconductor layer 103 and the first electrode(s) 111 is on the gate insulation film 113. In addition, the body region 170 having the first conductivity type may be in the semiconductor layer 103. The device isolation film 150 may be around (i.e., outside a peripheral boundary of) the body region 170. Within the device isolation film 150, the source region(s) 120 and the drain region 130 may be spaced apart from each other in the first direction. In addition, the isolation regions 160 may be at the sides of the source region(s) 120 and the drain region 130 (e.g., between one of the source regions 120 and the device isolation film 150, or in the drain region 130). Herein, the isolation regions 160 may be adjacent to and/or in an end (adjacent to or at the side of the second gate electrode 112) of the source region(s) 120 and/or the drain region 130, or may be across a center of the individual source region(s) 120 and/or drain region 130. No limitation thereto is imposed. As described above, it is preferable that the isolation regions 160 do not overlap with the first electrode(s) 111 in a height direction, and optionally, in a length (i.e., the second) direction.

In addition, in the extended area B, the gate insulation film 113 is on the semiconductor layer 103, and the second electrode 112 of the gate electrode is on the gate insulation film 113. In addition, a first well region 180 having the first conductivity type is in the semiconductor layer 103 to connect the body region 170 and a second well region 190, which will be described later. The first well regions 180 may be formed by an ion implantation process using p-type impurities after the device isolation film 150 and the isolation regions 160 are formed, and optionally, before the gate electrode 110 is formed. In addition, each of the first well regions 180 may be between the isolation regions 160 and below the second electrodes 112.

Referring to FIG. 5, the second active area A2 includes the second well region 190 having the first conductivity type in the semiconductor layer 103, and is connected to the body region 170 by the first well region 180, The second well region 190 may be formed by an ion implantation process using p-type impurities after the device isolation film 150 is formed. In addition, a well contact region 191 having the first conductivity type and a higher concentration of impurities than the second well region 190 may be on the second well region 190.

In order to prevent the occurrence of the kink effect that is caused because the electric potential of the floating body increases and a threshold voltage thus decreases, the RF switch device 100 includes the body contact regions 191 at the opposite sides or ends of the H-shaped gate electrode 110, respectively, so that holes in the body region 170 escape or flow through the body contact regions 191 at opposite ends of the RF switch device 100 through a metal contact [not shown] on an uppermost surface of the body contact region 191, into a metallization or wiring layer [not shown] on the metal contact), thereby improving the breakdown voltage (e.g., of the RF switch device 100).

In addition, according to the present disclosure, the isolation regions 160 effectively partially remove the source region(s) 120 and the drain region 130 (i.e., conductive regions in the first active area A1) from one or more areas adjacent to the second electrodes 112. Therefore, an increase in the parasitic capacitance Cgs between the gate electrode 110 and the source region(s) 120 and Cgd between the gate electrode 110 and the drain region 130 may be limited (e.g., as much as possible).

Figure 6:
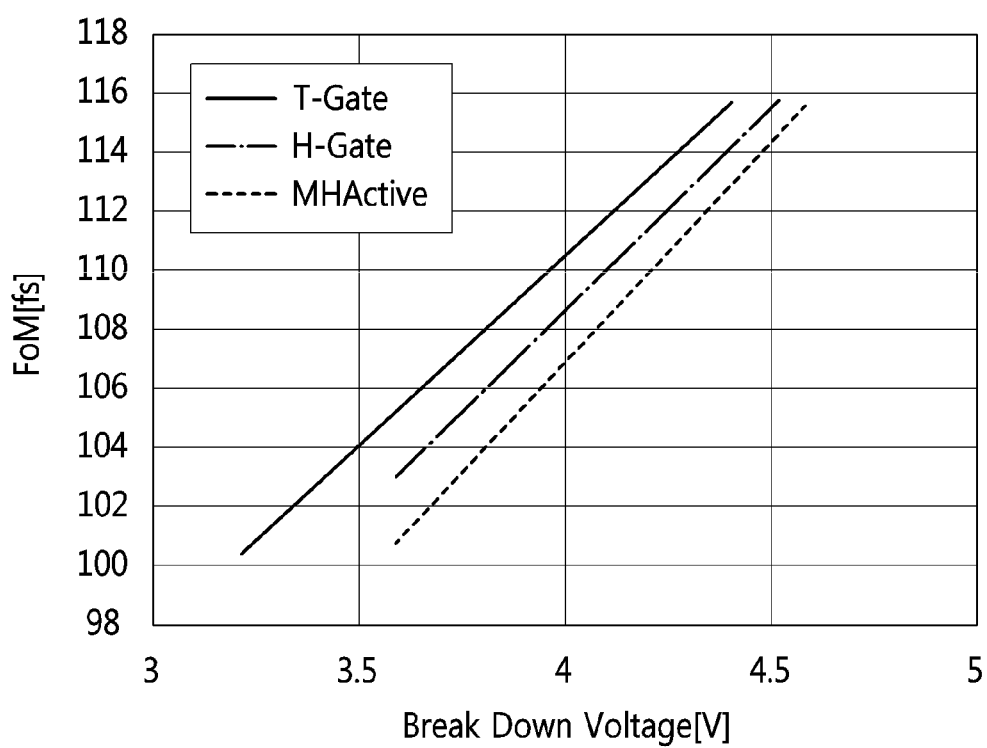
FIG. 6 is a graph showing an improvement relationship between the breakdown voltage and a figure of merit in the RF switch device of FIG. 2.

FIG. 6 is a graph showing the relationship between the breakdown voltage and a figure of merit (FoM) of the RF switch device 100 of FIG. 2.

Referring to FIG. 6, when compared with a similar or otherwise identical RF switch device having a T-shaped gate electrode as in the related art, the present RF switch device having an H-shaped gate electrode according to embodiment(s) of the present disclosure had a reduced figure of merit for the same breakdown voltage. In addition, when compared with the present RF switch device having an H-shaped gate electrode, an identical RF switch device further including the isolation regions 160 ("MHActive") had a reduced figure of merit for the same breakdown voltage. Therefore, regarding the RF switch device characteristics of breakdown voltage and the figure of merit, it is easily found that the H-shaped gate RF switch device (without isolation regions 160) is superior to the T-shaped gate RF switch device 900 in the related art, and the H-shaped gate RF switch device 100 further including the isolation regions 160 is relatively superior to the H-shaped gate RF switch device without isolation regions 160 in improving the characteristics of the device.

The foregoing detailed description illustrates the present disclosure. In addition, the foregoing illustrates and describes the preferred embodiments of the present disclosure and the present disclosure may be utilized in various other combinations, modifications and environments. That is, it is possible to make changes or modifications within the scope of the concept of the disclosure disclosed herein, within the scope of equivalents to the above described disclosure, and/or within the scope of the skill or knowledge of the art. The above-described embodiments are intended to describe the best mode for carrying out the technical spirit of the present disclosure, and various modifications required in the specific applications and uses of the present disclosure are possible. Accordingly, the foregoing detailed description is not intended to limit the present disclosure to the embodiments disclosed.

What is claimed is:

1. An RF switch device, comprising:
a first: active area including a source region having a second conductivity type and a drain region having the second conductivity type spaced apart from the source region in a first direction;
a pair of extended areas of which respective first ends are adjacent to opposite ends of the first active area in a second direction;
a pair of second active areas adjacent to second ends of the pair of the extended areas, respectively, the second active areas each including a body contact region; and
to an H-shaped gate electrode including a first electrode in the first active area, the first electrode having a length in the second direction, and a pair of second electrodes, each in respective ones of the pair of the extended areas and connected to opposite ends of the first electrode, the pair of second electrodes having a length in the first direction.

2. The RF switch device of claim 1, further comprising:
a buried oxide (BOX) layer on a semiconductor substrate; and
a semiconductor layer on the BOX layer.

3. The RF switch device of claim 2, wherein the first active area comprises a body region in the semiconductor layer, having a first conductivity type.

4. The RF switch device of claim 3, wherein each of the pair of extended areas comprises a first well region below the second electrode and in the semiconductor layer, having the first conductivity type.

5. The RF switch device of claim 4, wherein each of the pair of second active areas comprises a second well region in the semiconductor layer, having the first conductivity type, and
the second well region is connected to the body region through the first well region.

6. The RF switch device of claim 1, wherein the first active area comprises a body region in the semiconductor layer, and the RF switch device is configured such that holes in the body region can escape or flow through the pair of the second active areas.

7. An RF switch device, comprising:
a first active area including a source region having a second conductivity type and a drain region having the second conductivity type spaced apart from the source region in a first direction;
a pair of extended areas of which respective first ends are adjacent to opposite ends of the first active area in a second direction;
a pair of second active areas adjacent to respective second ends of the pair of extended areas, the second active areas each including a body contact region;
H-shaped gate electrode including a first electrode in the first active area, the first electrode having a length in the second direction, and second electrodes, each in respective ones of the pair of the extended areas and respectively connected to opposite ends of the first electrode, the pair of second electrodes having a length in the first direction, and
isolation regions below the second electrodes, in a semiconductor layer in the extended areas.

8. The RF switch device of claim 7, comprising a plurality of the first electrodes, wherein the isolation regions have a width thereof in the first direction that is smaller than a separation distance between adjacent ones of the plurality of the first electrodes.

9. The RF switch device of claim 7, comprising a plurality of the first electrodes, wherein the isolation regions do not overlap in the first direction with any of the plurality of first electrodes in the first active area.

10. The RF switch device of claim 9, wherein the isolation regions have ends facing each other in the second direction that are at least partially in the first active area.

11. The RF switch device of claim 7, further comprising:
a device isolation film around the first active area, the extended areas, and the second active areas.

12. The RF switch device of claim 7, further comprising a body region in the first active area, the body region having the first conductivity type, wherein the pair of the second active areas comprise contact regions having the first conductivity type in the semiconductor layer, and
the contact regions are connected to the body region.

13. An RF switch device, comprising:
a first active area including a source region a having second conductivity type and a drain region having the second conductivity type spaced apart from the source region in a first direction;
a pair of extended areas of which respective first ends are adjacent to opposite ends of the first active area in a second direction;
a pair of second active areas adjacent to second ends of the pair of the extended areas, the second active areas each including a body contact region; and
an H-shaped gate electrode including a first electrode in the first active area, the first electrode having a length in the second direction, and second electrodes connected to respective opposite ends of the first electrode, wherein each of the second electrodes is in a respective one of the pair of the extended areas and has a length in the first direction,
wherein the extended areas comprise multiple isolation regions in a semiconductor layer below the second electrodes, spaced apart from each other in the first direction, and
the isolation regions have ends thereof facing each other in the second direction that are at least partially in the first active area, and that do not overlap in the first direction with the first electrode in the first active area.

14. The RF switch device of claim 13, further comprising:
a buried oxide (BOX) layer on a semiconductor substrate;
the semiconductor layer on the BOX layer; and
a body region in the first active area,
wherein the first active area, the extended areas, and the second active areas comprise regions having a first conductivity type in the semiconductor layer, configured such that holes in the body region escape or flow through the pair of second active areas.

15. The RF switch device of claim 13, wherein the first active area comprises the source region and the drain region, and the semiconductor layer comprises a body region having a first conductivity type,
each of the pair of extended areas comprises a first well region in the semiconductor layer and below the second electrode, each extended area having the first conductivity type, and
each of the pair of second active areas comprises a second well region in the semiconductor layer, having the first conductivity type.

16. An RF switch device comprising a first active area having a channel region; a pair of extended areas having respective first ends adjacent to opposite ends of the first active area in a second direction; a pair of second active areas adjacent to respective second ends of the pair of the extended areas; a body region connected to the second active areas through the extended areas;
- a buried oxide (BOX) layer on a semiconductor substrate;
- a semiconductor layer on the BOX layer;
- an H-shaped gate electrode including a first electrode in the first active area, the first electrode having a length in the second direction, and second electrodes in the pair of extended areas, connected to the first electrode and having a length in a first direction;
- the body region, in the semiconductor layer in the first active area and having a first conductivity type;
- a source region and a drain region in the semiconductor layer, having a second conductivity type and spaced apart from each other by a predetermined distance; and
- multiple isolation regions in the extended areas, below the second electrodes and in the semiconductor layer, spaced apart from each other.

17. The RF switch device of claim 16, further comprising:
an additional drain region and an additional source region between facing sides of adjacent ones of the isolation regions in the first direction, configured to provide an additional channel region.

18. The RF switch device of claim 17, wherein the second electrodes have a width in the second direction less than 0.58 μm.

* * * * *